US010199522B2

(12) United States Patent
Palm et al.

(10) Patent No.: US 10,199,522 B2
(45) Date of Patent: Feb. 5, 2019

(54) SOLAR CELL INTERCONNECTOR AND MANUFACTURING METHOD THEREOF

(71) Applicant: AIRBUS DS GMBH, Taufkirchen (DE)

(72) Inventors: Frank Palm, Unterhaching (DE); Wiebke Steins, Ismaning (DE); Claus Zimmermann, Munich (DE)

(73) Assignee: AIRBUS DS GMBH, Taufkirchen (DE)

( * ) Notice: Subject to any disclaimer, the term of this patent is extended or adjusted under 35 U.S.C. 154(b) by 1179 days.

(21) Appl. No.: 14/533,338

(22) Filed: Nov. 5, 2014

(65) Prior Publication Data
US 2015/0122378 A1 May 7, 2015

(30) Foreign Application Priority Data
Nov. 6, 2013 (EP) .................... 13005233

(51) Int. Cl.
C22C 21/06 (2006.01)
H01L 31/05 (2014.01)
H01B 1/02 (2006.01)
C22F 1/04 (2006.01)
C22F 1/047 (2006.01)
C22F 1/057 (2006.01)
C22C 21/12 (2006.01)
C22C 21/16 (2006.01)

(52) U.S. Cl.
CPC .......... H01L 31/0512 (2013.01); C22C 21/06 (2013.01); C22C 21/12 (2013.01); C22C 21/16 (2013.01); C22F 1/04 (2013.01); C22F 1/047 (2013.01); C22F 1/057 (2013.01); H01B 1/023 (2013.01); Y02E 10/50 (2013.01)

(58) Field of Classification Search
CPC .................................................. C22C 21/06
See application file for complete search history.

(56) References Cited

U.S. PATENT DOCUMENTS

| | | | |
|---|---|---|---|
| 4,885,135 A | 12/1989 | Hosoda et al. | |
| 5,023,144 A | 6/1991 | Yamamoto et al. | |
| 5,841,071 A | 11/1998 | La Roche et al. | |
| 6,106,641 A | 8/2000 | Nishikawa et al. | |
| 2007/0231186 A1 | 10/2007 | Shima et al. | |
| 2012/0240995 A1* | 9/2012 | Coakley | H01L 31/0201 136/256 |
| 2013/0143070 A1 | 6/2013 | Palm | |
| 2013/0264115 A1 | 10/2013 | Kobayashi et al. | |
| 2014/0360712 A1* | 12/2014 | Fujita | C22F 1/00 165/185 |

FOREIGN PATENT DOCUMENTS

| | | |
|---|---|---|
| EP | 0 388 973 | 9/1990 |
| EP | 2 112 244 | 10/2009 |
| EP | 2 527 479 | 11/2012 |
| EP | 2 641 985 | 9/2013 |
| EP | 2 808 410 | 12/2014 |
| WO | 2013/111884 | 8/2013 |

OTHER PUBLICATIONS

Cabibbo et al., "A TEM Study of the Combined Effect of Severe Plastic Deformation and (Zr), (Sc+ZR)-Containing Dispersoids on an Al—Mg—Si Alloy," Journal of Material Science, Kluwer Academic Publishers, BO, vol. 41, No. 16, XP019399254, ISSN: 1573-4803, DOI: 10.1007/S10853-006-0306-2, pp. 5329-5338 (Jun. 6, 2006).

European Search Report/Office Action conducted in counterpart European Appln. No. 130 05 233.5-1355 (dated Nov. 6, 2017).

European Search Report conducted in counterpart European Appln. No. 130 05 233.5-1355 (dated Mar. 29, 2014).

* cited by examiner

Primary Examiner — Christopher S Kessler
(74) Attorney, Agent, or Firm — Greenblum & Bernstein, P.L.C.

(57) ABSTRACT

A high electrical conductive, high temperature stable foil material, a process for the preparation of such a high electrical conductive, high temperature stable foil material, a solar cell interconnector including the high electrical conductive, high temperature stable foil material as well as the use of the high electrical conductive, high temperature stable foil material and/or the solar cell interconnector in solar power, aircraft or space applications. The high electrical conductive, high temperature stable foil material includes an aluminum alloy that has at least two elements selected from the group of scandium (Sc), magnesium (Mg), zirconium (Zr), ytterbium (Yb) and manganese (Mn).

17 Claims, 3 Drawing Sheets

SOLAR CELL INTERCONNECTOR AND MANUFACTURING METHOD THEREOF

CROSS-REFERENCE TO RELATED APPLICATIONS

The present application claims priority under 35 U.S.C. § 119(a) of European Patent Application No. 13 005 233.5 filed Nov. 6, 2013, the disclosure of which is expressly incorporated by reference herein in its entirety.

BACKGROUND OF THE INVENTION

1. Field of the Invention

The present invention relates to a high electrical conductive, high temperature stable foil material, a process for the preparation of such a high electrical conductive, high temperature stable foil material, a solar cell interconnector comprising the high electrical conductive, high temperature stable foil material as well as the use of the high electrical conductive, high temperature stable foil material and/or the solar cell interconnector in solar power, aircraft or space applications.

2. Discussion of Background Information

In general, solar cells are used for electrical power generation on earth as well as in space. The principle of a solar cell is outlined in FIG. 1. For realizing the required operational voltage, numerous solar cells (1) are typically connected in series (called "string") via interconnectors (2), which are applied by welding or soldering to the solar cell contacts (3). The interconnectors (2) are typically manufactured by a chemical etching process or mechanical stamping out of thin metal foils in the range of 10 to 30 µm thickness. To avoid inducing an electrical resistance which decreases the power output, these interconnectors need to be sufficient electrically conductive to prevent an unacceptable voltage drop.

Furthermore, in space applications, the strings are usually bonded with a silicon adhesive (4) to a sandwich panel with carbon fiber facesheet and an aluminum honeycomb core (5) with Kapton frontside insulation (6). For radiation protection, a coverglass (9) is bonded to the solar cell (1) with transparent silicone adhesive (8). These substrates have a large thermal expansion mismatch relative to the solar cell (1). During eclipse phases with temperature fluctuations up to 200° C., the gap (7) between two solar cells (1), inside one string, varies by several 10 µm, which leads to significant thermo mechanical cyclic stress inside the interconnector material. To cope with this, it is state of the art to use 10 to 30 µm thick metal foils like Ag or Au (both might have some additives for strengthening). The advantage of these two materials is besides the good electrical conductivity, that these materials can be directly welded onto the Ag cell contacts. Other materials often used as interconnector materials are Mo, Kovar and Invar. The low coefficient of thermal expansion (CTE) of these materials reduces the overall gap variation making them good candidates for missions with several 10.000 eclipse phases (i.e. low earth orbit).

However, as these materials cannot be welded or soldered directly to the solar cell contacts, they are additionally plated with several µm of Ag or Au, which makes the process sensitive and expensive.

Several attempts have been made for strengthening of Ag and Au in terms of thermo mechanical cycling stability without losing the materials' advantages (i.e. corrosion resistance, good weidability and excellent electrical conductivity). For example, U.S. Pat. No. 5,841,071 describes an Au solar cell interconnector to which traces of silver, palladium and copper are added to achieve several 10.000 thermal cycles in low earth orbit (LEO) conditions. U.S. Pat. No. 4,885,135 (in this case for thin wires for bonding of semiconductors) describes to add some traces of the rare earth elements like lanthanum (La), cerium (Ce) etc. and some traces of germanium (Ge), beryllium (Be) and calcium (Ca). For strengthening of Ag similar elements can be used. U.S. Pat. No. 5,023,144 describes a Ag alloy foil for solar cell interconnectors which contains traces of calcium (Ca), beryllium (Be), lanthanum (La) and indium (In). This leads to an increased shelf life and temperature stability. US 2007/0231186 A1 describes that traces of copper (Cu), calcium (Ca) and strontium (Sr) are added.

However, even if the fatigue of the Ag and Au foil material induced by thermal cycling can be improved or even avoided with these described techniques, the susceptibility to Xe ion erosion for both Ag and Au and the susceptibility to atomic oxygen erosion in case of Ag cannot. In particular, the electrical solar cell contacts have to be bridged on opposite sides such that the electrical series connection has to be performed from the frontside contact of one cell to the rear side of the adjacent cell. To minimize the stresses induced into the interconnector material due to the thermally resulting gap variation, the interconnectors (2) are usually S shaped, which makes them significantly protruding above the cell coverglasses (9). However, here they are exposed to the atomic oxygen flux if operated in low earth orbit such that Ag gets highly attacked by the atomic oxygen. The comparable high difference in CTE of Ag and Ag oxide leads to a continuous material flaking (=material lost) at the surface (oxidation, flake-off due to thermal cycling, oxidation . . . ) and thus this sequence decreases the interconnector thickness over time and can even lead to a total loss due to interconnector breakage.

In addition, the above described geometry exposes the material to Xe ions emitted directly or in high angles with energies in the range of some 100 eV from electrical propulsion systems, that are routinely used for satellite attitude orbit control and increasingly for orbit raising itself. However, Ag and Au are highly eroded by these impinging Xe ions, so that, depending on the ion dose and the interconnector thickness, the electrical integrity of the solar array strings cannot be ensured and therefore the total power of the solar array can significantly degrade. One way to cope with these high erosion rates would be to use sufficient thick interconnectors. However, the risk of material back deposition of sputtered metal atoms is very high and can lead to short circuited solar cells and therefore again to a power loss. In addition thereto, the stress inside the S shaped interconnector loop (2) increases linear with the thickness and accordingly a thicker material would lead to a decrease in fatigue lifetime right at the start of the mission. Even by using more Xe ion erosion resistant materials like Mo or Invar, the protruding Ag or Au plating gets eroded and leads to the risk of back depositioning. Furthermore, as the erosion rate is dependent on the incident angle, a non-homogenous erosion profile over the interconnector length can result in higher stresses during thermo mechanical cycling. Again, the total power of the solar array can degrade, if it comes to a numerous breakage of interconnectors due to this reason.

Accordingly, there is still a demand for highly electrical conductive foil materials having an improved thermo mechanical stability and being atomic oxygen resistant and Xe ion erosion resistant.

Thus, the object of the present invention is to provide a foil material having an improved thermo mechanical stability with high electrical conductivity and being atomic oxygen resistant and Xe ion erosion resistant.

The foregoing and other objectives are solved by the subject-matter as defined herein in claim 1. Advantageous embodiments of the inventive foil material are defined in the corresponding sub-claims.

SUMMARY OF THE EMBODIMENTS

According to one aspect of the present application, a high electrical conductive, high temperature stable foil material comprising an aluminium alloy is provided, the aluminium alloy comprises at least two elements selected from the group consisting of scandium (Sc), magnesium (Mg), zirconium (Zr) ytterbium (Yb) and manganese (Mn).

The inventors surprisingly found out that the foregoing high electrical conductive, high temperature stable foil material has an improved thermo mechanical stability and, furthermore, features an atomic oxygen resistance as well as Xe ion erosion resistance.

It should be understood that for the purposes of the present invention, the following terms have the following meanings:

Where the term "comprising" is used in the present description and claims, it does not exclude other non-specified elements of major or minor functional importance. For the purposes of the present invention, the term "consisting of" is considered to be a preferred embodiment of the term "comprising of". If hereinafter a group is defined to comprise at least a certain number of embodiments, this is also to be understood to disclose a group, which preferably consists only of these embodiments.

Whenever the terms "including" or "having" are used, these terms are meant to be equivalent to "comprising" as defined above.

Where an indefinite or definite article is used when referring to a singular noun, e.g. "a", "an" or "the", this includes a plural of that noun unless something else is specifically stated.

According to another aspect of the present invention, a process for the preparation of a high electrical conductive, high temperature stable foil material is provided, the process comprising the steps of:
a) melting a pre-material comprising aluminium and at least two elements selected from the group consisting of scandium (Sc), magnesium (Mg), zirconium (Zr), ytterbium (Yb) and manganese (Mn) for forming a molten aluminium alloy,
b) cooling the molten aluminium alloy to room temperature for forming a solidified aluminium alloy,
c) rolling the solidified aluminium alloy to a thickness of from 5.0 µm to 100.0 µm for forming a rolled aluminium alloy, and
d) annealing the rolled aluminium alloy at a temperature of at least 250° C.

According to a further aspect of the present invention, a solar cell interconnector comprising the high electrical conductive, high temperature stable foil material is provided. According to another aspect of the present invention, the use of the high electrical conductive, high temperature stable foil material and/or the solar cell interconnector in solar power, aircraft or space applications is provided.

According to one embodiment of the present invention, the aluminium alloy comprises a) scandium (Sc) in an amount from 0.1 to 1.0 wt.-%, based on the total weight of the aluminium alloy, and/or b) magnesium (Mg) in an amount from 0.1 to 5.0 wt.-%, based on the total weight of the aluminium alloy, and/or c) zirconium (Zr) in an amount from 0.075 to 0.5 wt.-%, based on the total weight of the aluminium alloy, and/or d) ytterbium (Yb) in an amount from 0.075 to 0.5 wt.-%, based on the total weight of the aluminium, alloy and/or e) manganese (Mn) in an amount from 0.075 to 0.6 wt.-%, based on the total weight of the aluminium alloy.

According to another embodiment of the present invention, the aluminium alloy comprises two or three or four elements selected from the group consisting of scandium (Sc), magnesium (Mg), zirconium (Zr), ytterbium (Yb) and manganese (Mn).

According to yet another embodiment of the present invention, the aluminium alloy comprises a) scandium (Sc) in an amount from 0.1 to 1.0 wt.-% and zirconium (Zr) in an amount from 0.075 to 0.5 wt.-%, based on the total weight of the aluminium alloy, or b) scandium (Sc) in an amount from 0.1 to 1.0 wt.-% and ytterbium (Yb) in an amount from 0.075 to 0.5 wt.-%, based on the total weight of the aluminium alloy, or c) scandium (Sc) in an amount from 0.1 to 1.0 wt.-% and magnesium (Mg) in an amount from 0.1 to 3.2 wt.-%, based on the total weight of the aluminium alloy, or d) magnesium (Mg) in an amount from 0.1 to 3.2 wt.-% and ytterbium (Yb) in an amount from 0.075 to 0.5 wt.-%, based on the total weight of the aluminium alloy.

According to one embodiment of the present invention, the aluminium alloy comprises scandium (Sc) in an amount from 0.1 to 1.0 wt.-%, zirconium (Zr) in an amount from 0.075 to 0.5 wt.-% and ytterbium (Yb) in an amount from 0.075 to 0.5 wt.-%, based on the total weight of the aluminium alloy. Additionally or alternatively the aluminium alloy comprises scandium (Sc), zirconium (Zr) and ytterbium (Yb) in a weight ratio [Sc/Zr/Yb] from $1/\frac{1}{2}/\frac{1}{4}$ to $1/\frac{1}{3}/\frac{1}{3}$.

According to another embodiment of the present invention, the aluminium alloy comprises magnesium (Mg) in an amount from 0.1 to 5.0 wt.-%, scandium (Sc) in an amount from 0.1 to 1.0 wt.-%, manganese (Mn) in an amount from 0.075 to 0.6 wt.-% and zirconium (Zr) in an amount from 0.075 to 0.5 wt.-%, based on the total weight of the aluminium alloy. Additionally or alternatively, the aluminium alloy comprises magnesium (Mg), scandium (Sc), manganese (Mn) and zirconium (Zr) in a weight ratio [Mg/Sc/Mn/Zr] from $1/\frac{1}{18}/\frac{1}{57}/\frac{1}{51}$ to $1/\frac{1}{20}/\frac{1}{7}/\frac{1}{40}$.

According to yet another embodiment of the present invention, the aluminium alloy comprises at least one further alloying element selected from the group comprising copper (Cu), manganese (Mn), magnesium-silicium (Mg—Si), zinc (Zn), lithium (Li), silver (Ag) and mixtures thereof in a total amount of ≤5.0 wt.-%, based on the total weight of the aluminium alloy.

According to one embodiment of the present invention, the aluminium alloy comprises at least one further alloying element selected from the group comprising iron (Fe), nickel (Ni), cobalt (Co), chromium (Cr), vanadium (V), titanium (Ti), niobium (Nb), tantalum (Ta), molybdenum (Mo), wolfram (W), hafnium (Hf) and mixtures thereof in a total amount of ≤2.0 wt.-%, based on the total weight of the aluminium alloy.

According to another embodiment of the present invention, the aluminium alloy comprises at least one further alloying element selected from the group comprising at least one further alloying element selected from the group comprising lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu) and mixtures thereof in a total amount of ≤1.0 wt.-%, based on the total weight of the aluminium alloy.

According to yet another embodiment of the present invention, the aluminium alloy comprises at least one further alloying element selected from the group comprising calcium (Ca), beryllium (Be), strontium (Sr), barium (Ba) and mixtures thereof in a total amount of ≤0.5 wt.-%, based on the total weight of the aluminium alloy.

According to one embodiment of the present invention, the high electrical conductive, high temperature stable foil material has a thickness ranging from 5.0 µm to 100 µm.

According to another embodiment of the present invention, the high electrical conductive, high temperature stable foil material features at room temperature, after being exposed to a temperature of 200° C. for at least 100 hours, the same hardness and/or strength than before the temperature exposure.

Other exemplary embodiments and advantages of the present invention may be ascertained by reviewing the present disclosure and the accompanying drawing.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein: The following examples may additionally illustrate the invention but are not meant to restrict the invention to the exemplified embodiments.

DETAILED DESCRIPTION OF THE EMBODIMENTS

Figure 1:
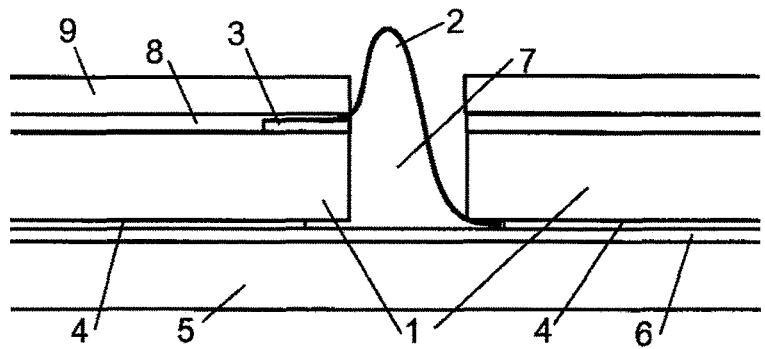
FIG. 1 illustrates the principle of a solar cell.

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

The present invention relates to a high electrical conductive, high temperature stable foil material comprising an aluminium alloy, the aluminium alloy comprises at least two elements selected from the group consisting of scandium (Sc), magnesium (Mg), zirconium (Zr), ytterbium (Yb) and manganese (Mn).

The term "high electrical conductive", high temperature stable foil material in the meaning of the present invention refers to a foil material having an electrical conductivity of at least 10.0 MS/m, preferably of at least 20.0 MS/m and most preferably from 20.0 to 35.0 MS/m. Additionally or alternatively, the term "high electrical conductive", high temperature stable foil material in the meaning of the present invention refers to a foil material that features at room temperature, after a temperature exposure to 200° C. for at least 100 hours, the same electrical conductivity than before the temperature exposure. For example, the foil material features at room temperature, after a temperature exposure to 200° C. for at least 100 hours, the same electrical conductivity than before the temperature exposure. Alternatively, the foil material features at room temperature, after a temperature exposure to 200° C. for at least 100 hours, the same electrical conductivity than before the temperature exposure.

The term "the same electrical conductivity than before the temperature exposure" in the meaning of the present invention refers to the electrical conductivity determined for the same high electrical conductive, high temperature stable foil material before it is exposed to high temperatures, preferably a temperature of about 200° C. In other words, the high electrical conductive, high temperature stable foil material features before and after the high temperature exposure, preferably to a temperature of about 200° C., the same electrical conductivity.

The term high electrical conductive, "high temperature stable" foil material in the meaning of the present invention refers to a foil material whose room temperature hardness and/or strength does not change after increased temperature exposure. For example, the room temperature hardness and strength of the foil material is not affected by increased temperature exposure. Thus, it is appreciated that the foil material features at room temperature, i.e. at about 20° C., after high temperature exposure, the same hardness and/or strength, than before the temperature exposure. For example, the foil material features at room temperature, after a temperature exposure to about 200° C., the same hardness and/or strength than before the temperature exposure.

In one embodiment of the present invention, the foil material features at room temperature, after a temperature exposure to 200° C. for at least 100 hours, the same hardness and/or strength than before the temperature exposure. For example, the foil material features at room temperature, after a temperature exposure to 200° C. for at least 100 hours, the same hardness or strength than before the temperature exposure. Alternatively, the foil material features at room temperature, after a temperature exposure to 200° C. for at least 100 hours, the same hardness and strength than before the temperature exposure.

The term "the same hardness and/or strength than before the temperature exposure" in the meaning of the present invention refers to the hardness and/or strength determined for the same high electrical conductive, high temperature stable foil material before it is exposed to high temperatures, preferably a temperature of about 200° C. In other words, the high electrical conductive, high temperature stable foil material features before and after the high temperature exposure, preferably to a temperature of about 200° C., the same hardness and/or strength.

The term high electrical conductive, high temperature stable "foil material" in the meaning of the present invention refers to a material being a thin, flexible leaf or sheet of the respective material. In particular, it is appreciated that the term "thin" in the meaning of the present invention refers to a foil material having a thickness of from 5.0 to 100.0 μm, preferably from 5.0 to 50.0 μm.

In one embodiment of the present invention, the high electrical conductive, high temperature stable foil material has a thickness of from 5.0 μm to 100.0 μm, preferably from 5.0 μm to 75.0 μm, more preferably from 5.0 μm to 50.0 μm and most preferably from 5.0 μm to 25.0 μm. For example, the high electrical conductive, high temperature stable foil material has a thickness of from 5.0 μm to 50.0 μm, like from 10.0 μm to 25.0 μm.

It is one requirement of the present invention that the high electrical conductive, high temperature stable foil material comprises an aluminium alloy. It is thus appreciated that the base material is aluminium.

Within the framework of the present invention, the term "aluminium" is understood as a metallic material that essentially consists of aluminium, and can be alloyed with other metals.

It is a further requirement of the present invention that that the aluminium alloy, i.e. the high electrical conductive, high temperature stable foil material, comprises at least two elements selected from the group consisting of scandium (Sc), magnesium (Mg), zirconium (Zr), ytterbium (Yb) and manganese (Mn).

In one embodiment of the present invention, the aluminium alloy, i.e. the high electrical conductive, high temperature stable foil material, comprises scandium (Sc) in an amount from 0.1 to 1.0 wt.-%, based on the total, weight of the aluminium alloy. For example, the aluminium alloy, i.e. the high electrical conductive, high temperature stable foil material, comprises scandium (Sc) in an amount from 0.1 to 0.8 wt.-%, preferably from 0.3 to 0.8 wt.-% and most preferably from 0.5 to 0.7 wt.-%, based on the total weight of the aluminium alloy. In one embodiment of the present invention, the aluminum alloy, i.e. the high electrical conductive, high temperature stable foil material, comprises scandium (Sc) in an amount of about 0.6 wt.-%, based on the total weight of the aluminium alloy.

Within the framework of the present invention, the term "scandium" is understood as a metallic material that essentially consists of scandium, and can be alloyed to aluminium.

Additionally or alternatively, the aluminium alloy, i.e. the high electrical conductive, high temperature stable foil material, comprises magnesium (Mg) in an amount from 0.1 to 5.0 wt.-%, based on the total weight of the aluminium alloy. For example, the aluminium alloy, i.e. the high electrical conductive, high temperature stable foil material, comprises magnesium (Mg) in an amount from 1.0 to 4.6 wt.-%, preferably from 2.0 to 4.6 wt.-% and most preferably from 2.5 to 4.6 wt.-%, based on the total weight of the aluminium alloy. In one embodiment of the present invention, the aluminum alloy, i.e. the high electrical conductive, high temperature stable foil material, comprises magnesium (Mg) in an amount of about 3.0 wt.-%, based on the total weight of the aluminium alloy.

Within the framework of the present invention, the term "magnesium" is understood as a metallic material that essentially consists of magnesium, and can be alloyed to aluminium.

Additionally or alternatively, the aluminium alloy, i.e. the high electrical conductive, high temperature stable foil material, comprises zirconium (Zr) in an amount from 0.075 to 0.5 wt.-%, based on the total weight of the aluminium alloy. For example, the aluminium alloy, i.e. the high electrical conductive, high temperature stable foil material, comprises zirconium (Zr) in an amount from 0.085 to 0.5 wt.-%, preferably from 0.2 to 0.4 wt.-% and most preferably from 0.25 to 0.35 wt.-%, based on the total weight of the aluminium alloy. In one embodiment of the present invention, the aluminum alloy, i.e. the high electrical conductive, high temperature stable foil material, comprises zirconium (Zr) in an amount of about 0.3 wt.-%, based on the total weight of the aluminium alloy.

Within the framework of the present invention, the term "zirconium" is understood as a metallic material that essentially consists of zirconium, and can be alloyed to aluminium.

Additionally or alternatively, the aluminium alloy, i.e. the high electrical conductive, high temperature stable foil material, comprises ytterbium (Yb) in an amount from 0.075 to 0.5 wt.-%, based on the total weight of the aluminium alloy. For example, the aluminium alloy, i.e. the high electrical conductive, high temperature stable foil material, comprises ytterbium (Yb) in an amount from 0.1 to 0.5 wt.-%, preferably from 0.1 to 0.35 wt.-% and most preferably from 0.1 to 0.2 wt.-%, based on the total weight of the aluminium alloy. In one embodiment of the present invention, the aluminum alloy, i.e. the high electrical conductive, high temperature stable foil material, comprises ytterbium (Yb) in an amount of about 0.15 wt.-%, based on the total weight of the aluminium alloy.

Within the framework of the present invention, the term "ytterbium" is understood as a metallic material that essentially consists of ytterbium, and can be alloyed to aluminium.

Additionally or alternatively, the aluminium alloy, i.e. the high electrical conductive, high temperature stable foil material, comprises manganese (Mn) in an amount from 0.075 to 0.6 wt.-%, based on the total weight of the aluminium alloy. For example, the aluminium alloy, i.e. the high electrical conductive, high temperature stable foil material, comprises manganese (Mn) in an amount from 0.08 to 0.6 wt.-%, preferably from 0.08 to 0.35 wt.-% and most preferably from 0.08 to 0.2 wt.-%, based on the total weight of the aluminium alloy. In one embodiment of the present invention, the aluminum alloy, i.e. the high electrical conductive, high temperature stable foil material, comprises manganese (Mn) in an amount of about 0.08 wt.-%, based on the total weight of the aluminium alloy.

Within the framework of the present invention, the term "manganese" is understood as a metallic material that essentially consists of manganese, and can be alloyed to aluminium.

In one embodiment of the present invention, it is appreciated that the aluminium alloy, i.e. the high electrical conductive, high temperature stable foil material, preferably comprises two to four elements selected from the group consisting of scandium (Sc), magnesium (Mg), zirconium (Zr), ytterbium (Yb) and manganese (Mn).

Accordingly, the aluminium alloy, i.e. the high electrical conductive, high temperature stable foil material, comprises two or three or four elements selected from the group consisting of scandium (Sc), magnesium (Mg), zirconium (Zr), ytterbium (Yb) and manganese (Mn).

For example, the aluminium alloy, i.e. the high electrical conductive, high temperature stable foil material, comprises two elements selected from the group consisting of scandium (Sc), magnesium (Mg), zirconium (Zr), ytterbium (Yb) and manganese (Mn).

If the aluminium alloy, i.e. the high electrical conductive, high temperature stable foil material, comprises two elements selected from the group consisting of scandium (Sc), magnesium (Mg), zirconium (Zr), ytterbium (Yb) and manganese (Mn), the aluminium alloy, i.e. the foil material, preferably comprises scandium (Sc) and magnesium (Mg). Alternatively, the aluminium alloy, i.e. the foil material, preferably comprises magnesium (Mg) and ytterbium (Yb). Alternatively, the aluminium alloy, i.e. the foil material, preferably comprises scandium (Sc) and zirconium (Zr). Alternatively, the aluminium alloy, i.e. the foil material, preferably comprises scandium (Sc) and ytterbium (Yb). Alternatively, the aluminium alloy, i.e. the foil material, preferably comprises scandium (Sc) and manganese (Mn).

For example, if the aluminium alloy, i.e. the high electrical conductive, high temperature stable foil material, comprises scandium (Sc) and magnesium (Mg), the aluminium alloy comprises scandium (Sc) in an amount from 0.1 to 1.0 wt.-% and magnesium (Mg) in an amount from 0.1 to 3.2 wt.-%, based on the total weight of the aluminium alloy. Preferably, the aluminium alloy comprises scandium (Sc) in an amount from 0.1 to 0.8 wt.-% and magnesium (Mg) in an amount from 1.0 to 3.2 wt.-%, based on the total weight of the aluminium alloy. More preferably, the aluminium alloy comprises scandium (Sc) in an amount from 0.1 to 0.4 wt.-% and magnesium (Mg) in an amount from 2.5 to 3.2 wt.-%, based on the total weight of the aluminium alloy. Most preferably, the aluminium alloy comprises scandium (Sc) in an amount of about 0.2 wt.-% and magnesium (Mg) in an amount of about 3.0 wt.-%, based on the total weight of the aluminium alloy.

If the aluminium alloy, i.e. the high electrical conductive, high temperature stable foil material, comprises magnesium (Mg) and ytterbium (Yb), the aluminium alloy comprises magnesium (Mg) in an amount from 0.1 to 3.2 wt.-% and ytterbium (Yb) in an amount from 0.075 to 0.5 wt.-%, based on the total weight of the aluminium alloy. Preferably, the aluminium alloy comprises magnesium (Mg) in an amount from 1.0 to 3.2 wt.-% and ytterbium (Yb) in an amount from 0.1 to 0.5 wt.-%, based on the total weight of the aluminium alloy. More preferably, the aluminium alloy comprises magnesium (Mg) in an amount from 2.5 to 3.2 wt.-% and and ytterbium (Yb) in an amount from 0.35 to 0.45 wt.-%, based on the total weight of the aluminium alloy. Most preferably, the aluminium alloy comprises magnesium (Mg) in an amount of about 3.0 wt.-% and ytterbium (Yb) in an amount of about 0.4 wt.-%, based on the total weight of the aluminium alloy.

If the aluminium alloy, i.e. the high electrical conductive, high temperature stable foil material, comprises scandium (Sc) and zirconium (Zr), the aluminium alloy comprises scandium (Sc) in an amount from 0.1 to 1.0 wt.-% and zirconium (Zr) in an amount from 0.075 to 0.5 wt.-%, based on the total weight of the aluminium alloy. Preferably, the aluminium alloy comprises scandium (Sc) in an amount from 0.1 to 0.8 wt.-% and zirconium (Zr) in an amount from 0.085 to 0.5 wt.-%, based on the total weight of the aluminium alloy. More preferably, the aluminium alloy comprises scandium (Sc) in an amount from 0.5 to 0.7 wt.-% and zirconium (Zr) in an amount from 0.2 to 0.4 wt.-%, based on the total weight of the aluminium alloy. Most preferably, the aluminium alloy comprises scandium (Sc) in an amount of about 0.6 wt.-% and zirconium (Zr) in an amount of about 0.3 wt.-%, based on the total weight of the aluminium alloy.

If the aluminium alloy, i.e. the high electrical conductive, high temperature stable foil material, comprises scandium (Sc) and ytterbium (Yb), the aluminium alloy comprises scandium (Sc) in an amount from 0.1 to 1.0 wt.-% and ytterbium (Yb) in an amount from 0.075 to 0.5 wt.-%, based on the total weight of the aluminium alloy. Preferably, the aluminium alloy comprises scandium (Sc) in an amount from 0.1 to 0.8 wt.-% and ytterbium (Yb) in an amount from 0.1 to 0.5 wt.-%, based on the total weight of the aluminium alloy. More preferably, the aluminium alloy comprises scandium (Sc) in an amount from 0.5 to 0.7 wt.-% and ytterbium (Yb) in an amount from 0.1 to 0.2 wt.-%, based on the total weight of the aluminium alloy. Most preferably, the aluminium alloy comprises scandium (Sc) in an amount of about 0.6 wt.-% and ytterbium (Yb) in an amount of about 0.15 wt.-%, based on the total weight of the aluminium alloy.

If the aluminium alloy, i.e. the high electrical conductive, high temperature stable foil material, comprises scandium (Sc) and manganese (Mn), the aluminium alloy comprises scandium (Sc) in an amount from 0.1 to 1.0 wt.-% and manganese (Mn) in an amount from 0.075 to 0.6 wt.-%, based on the total weight of the aluminium alloy. Preferably, the aluminium alloy comprises scandium (Sc) in an amount from 0.1 to 0.8 wt.-% and manganese (Mn) in an amount from 0.08 to 0.6 wt.-%, based on the total weight of the aluminium alloy. More preferably, the aluminium alloy comprises scandium (Sc) in an amount from 0.5 to 0.7 wt.-% and manganese (Mn) in an amount from 0.08 to 0.35 wt.-%, based on the total weight of the aluminium alloy. Most preferably, the aluminium alloy comprises scandium (Sc) in an amount of about 0.6 wt.-% and manganese (Mn) in an amount of about 0.08 wt.-%, based on the total weight of the aluminium alloy.

Alternatively, the aluminium alloy, i.e. the high electrical conductive, high temperature stable foil material, comprises three elements selected from the group consisting of scandium (Sc), magnesium (Mg), zirconium (Zr), ytterbium (Yb) and manganese (Mn). For example, the aluminium alloy, i.e. the high electrical conductive, high temperature stable foil material, comprises scandium (Sc), zirconium (Zr) and ytterbium (Yb).

If the aluminium alloy, i.e. the high electrical conductive, high temperature stable foil material, comprises scandium (Sc), zirconium (Zr) and ytterbium (Yb), the aluminium alloy preferably comprises scandium (Sc) in an amount from 0.1 to 1.0 wt.-%, zirconium (Zr) in an amount from 0.075 to 0.5 wt.-% and ytterbium (Yb) in an amount from 0.075 to 0.5 wt.-%, based on the total weight of the aluminium alloy.

Preferably, the aluminium alloy, i.e. the high electrical conductive, high temperature stable foil material, comprises scandium (Sc) in an amount from 0.3 to 0.8 wt.-%, zirconium (Zr) in an amount from 0.2 to 0.4 wt.-% and ytterbium (Yb) in an amount from 0.1 to 0.35 wt.-%, based on the total weight of the aluminium alloy. More preferably, the aluminium alloy comprises scandium (Sc) in an amount from 0.5 to 0.7 wt.-%, zirconium (Zr) in an amount from 0.25 to 0.35 wt.-% and ytterbium (Yb) in an amount from 0.1 to 0.2 wt.-%, based on the total weight of the aluminium alloy. Most preferably, the aluminium alloy comprises scandium (Sc) in an amount of about 0.6 wt.-%, zirconium (Zr) in an amount of about 0.3 wt.-% and ytterbium (Yb) in an amount of about 0.15 wt.-%, based on the total weight of the aluminium alloy.

If the aluminium alloy, i.e. the foil material, comprises scandium (Sc), zirconium (Zr) and ytterbium (Yb), it is appreciated that the aluminium alloy comprises the three elements in a specific weight ratio.

In one embodiment of the present invention, the aluminium alloy, i.e. the high electrical conductive, high temperature stable foil material, comprises scandium (Sc), zirconium (Zr) and ytterbium (Yb) in a weight ratio [Sc/Zr/Yb] from $1/\frac{1}{2}/\frac{1}{4}$ to $1/\frac{1}{3}/\frac{1}{3}$. For example, the aluminium alloy, i.e. the high electrical conductive, high temperature stable foil material, comprises scandium (Sc), zirconium (Zr) and ytterbium (Yb) in a weight ratio [Sc/Zr/Yb] from $1/\frac{1}{2}/\frac{1}{4}$ to $1/\frac{1}{3}/\frac{1}{4}$, preferably from $1/\frac{1}{2}/\frac{1}{4}$ to $1/\frac{1}{3}/\frac{1}{6}$ and most preferably from $1/1/2/1/4$ to $1/\frac{1}{4}/\frac{1}{8}$. In one embodiment of the present invention, the aluminium alloy, i.e. the high electrical conductive, high temperature stable foil material, comprises scandium (Sc), zirconium (Zr) and ytterbium (Yb) in a weight ratio [Sc/Zr/Yb] of about $1/\frac{1}{2}/\frac{1}{4}$. Such weight ratio is advantageous for obtaining an aluminium alloy, i.e. the high electrical conductive, high temperature stable foil material, having an increased thermo mechanical stability.

In one embodiment of the present invention, the aluminium alloy, i.e. the high electrical conductive, high temperature stable foil material, comprises four elements selected from the group consisting of scandium (Sc), magnesium (Mg), zirconium (Zr), ytterbium (Yb) and manganese (Mn). For example, the aluminium alloy, i.e. the high electrical conductive, high temperature stable foil material, comprises magnesium (Mg), scandium (Sc), zirconium (Zr) and manganese (Mn).

If the aluminium alloy, i.e. the high electrical conductive, high temperature stable foil material, comprises magnesium (Mg), scandium (Sc), zirconium (Zr) and manganese (Mn), the aluminium alloy preferably comprises magnesium (Mg) in an amount from 0.1 to 5.0 wt.-%, scandium (Sc) in an amount from 0.1 to 1.0 wt.-%, zirconium (Zr) in an amount from 0.075 to 0.5 wt.-%, and manganese (Mn) in an amount from 0.075 to 0.6 wt.-%, based on the total weight of the aluminium alloy.

Preferably, the aluminium alloy, i.e. the high electrical conductive, high temperature stable foil material, comprises magnesium (Mg) in an amount from 2.5 to 4.6 wt.-%, scandium (Sc) in an amount from 0.1 to 0.3 wt.-%, zirconium (Zr) in an amount from 0.075 to 0.15 wt.-%, and manganese (Mn) in an amount from 0.08 to 0.6 wt.-%, based on the total weight of the aluminium alloy. More preferably, the aluminium alloy comprises magnesium (Mg) in an amount from 3.2 to 4.6 wt.-%, scandium (Sc) in an amount from 0.15 to 0.3 wt.-%, zirconium (Zr) in an amount from 0.075 to 0.15 wt.-%, and manganese (Mn) in an amount from 0.08 to 0.6 wt.-%, based on the total weight of the aluminium alloy. Most preferably, the aluminium alloy comprises magnesium (Mg) in an amount of about 4.6 wt.-%, scandium (Sc) in an amount of about 0.26 wt.-%, zirconium (Zr) in an amount of about 0.09 wt.-%, and manganese (Mn) in an amount of about 0.08 wt.-%, based on the total weight of the aluminium alloy.

If the aluminium alloy, i.e. the high electrical conductive, high temperature stable foil material, comprises magnesium (Mg), scandium (Sc), zirconium (Zr) and manganese (Mn), it is appreciated that the aluminium alloy comprises the four elements in a specific weight ratio.

In one embodiment of the present invention, the aluminium alloy, i.e. the high electrical conductive, high temperature stable foil material, comprises magnesium (Mg), scandium (Sc), manganese (Mn) and zirconium (Zr) in a weight ratio [Mg/Sc/Mn/Zr] from $1/\frac{1}{18}/\frac{1}{57}/\frac{1}{51}$ to $1/\frac{1}{20}/\frac{1}{7}/\frac{1}{40}$. In one embodiment of the present invention, the aluminium alloy, i.e. the high electrical conductive, high temperature stable foil material, comprises magnesium (Mg), scandium (Sc), manganese (Mn) and zirconium (Zr) in a weight ratio [Mg/Sc/Mn/Zr] of about $1/\frac{1}{18}/\frac{1}{57}/\frac{1}{51}$. Such weight ratio is advantageous for obtaining an aluminium alloy, i.e. the foil material, having an increased thermo mechanical stability.

In one embodiment of the present invention, the aluminium alloy is selected from the group comprising AlSc0.6Zr0.3, AlSc0.6Zr0.3Yb0.15, AlMg4.6Sc0.26Mn0.08Zr0.09 and AlMg4.0Sc0.2Mn0.6Zr0.1.

Additionally, the aluminium alloy, i.e. the high electrical conductive, high temperature stable foil material, can comprise further alloying elements.

In one embodiment of the present invention, the aluminium alloy, i.e. the high electrical conductive, high temperature stable foil material, comprises at least one further alloying element selected from the group comprising copper (Cu), manganese (Mn), magnesium-silicium (Mg—Si), zinc (Zn), lithium (Li), silver (Ag) and mixtures thereof. For example, the aluminium alloy, i.e. the foil material, comprises one further alloying element selected from the group comprising copper (Cu), manganese (Mn), magnesium-silicium (Mg—Si), zinc (Zn), lithium (Li), silver (Ag) and mixtures thereof. Alternatively, the aluminium alloy, i.e. the high electrical conductive, high temperature stable foil material, comprises two or three further alloying elements selected from the group comprising copper (Cu), manganese (Mn), magnesium-silicium (Mg—Si), zinc (Zn), lithium (Li), silver (Ag) and mixtures thereof.

If the aluminium alloy, i.e. the high electrical conductive, high temperature stable foil material, comprises at least one further alloying element selected from the group comprising copper (Cu), manganese (Mn), magnesium-silicium (Mg—Si), zinc (Zn), lithium (Li), silver (Ag) and mixtures thereof, the aluminium alloy comprises the at least one further alloying element preferably in a total amount of ≤5.0 wt.-%, based on the total weight of the aluminium alloy. For example, the aluminium alloy comprises the at least one further alloying element selected from the group comprising copper (Cu), manganese (Mn), magnesium-silicium (Mg—Si), zinc (Zn), lithium (Li), silver (Ag) and mixtures thereof in a total amount of from 0.05 to 5.0 wt.-%, preferably from 0.05 to 4.0 wt.-%, based on the total weight of the aluminium alloy.

The term "total amount" in the meaning of the present invention refers to the amount of the single element in the aluminium alloy. Furthermore, if the aluminium alloy comprises two or more elements, like two or three or four elements, said term refers to the sum of the amounts of the two or more elements in the aluminium alloy.

Additionally or alternatively, the aluminium alloy comprises at least one further alloying element selected from the group comprising iron (Fe), nickel (Ni), cobalt (Co), chromium (Cr), vanadium (V), titanium (Ti), niobium (Nb), tantalum (Ta), molybdenum (Mo), wolfram (W), hafnium (Hf) and mixtures thereof. For example, the aluminium alloy comprises one further alloying element selected from the group comprising iron (Fe), nickel (Ni), cobalt (Co), chromium (Cr), vanadium (V), titanium (Ti), niobium (Nb), tantalum (Ta), molybdenum (Mo), wolfram (W), hafnium (Hf) and mixtures thereof. Alternatively, the aluminium alloy comprises two or three further alloying elements selected from the group comprising iron (Fe), nickel (Ni), cobalt (Co), chromium (Cr), vanadium (V), titanium (Ti), niobium (Nb), tantalum (Ta), molybdenum (Mo), wolfram (W), hafnium (Hf) and mixtures thereof.

If the aluminium alloy, i.e. the high electrical conductive, high temperature stable foil material, comprises at least one further alloying element selected from the group comprising iron (Fe), nickel (Ni), cobalt (Co), chromium (Cr), vanadium (V), titanium (Ti), niobium (Nb), tantalum (Ta), molybdenum (Mo), wolfram (W), hafnium (Hf) and mixtures thereof, the aluminium alloy comprises the at least one further alloying element preferably in a total amount of ≤2.0 wt.-%, based on the total weight of the aluminium alloy. For example, the aluminium alloy comprises the at least one further alloying element selected from the group comprising iron (Fe), nickel (Ni), cobalt (Co), chromium (Cr), vanadium (V), titanium (Ti), niobium (Nb), tantalum (Ta), molybdenum (Mo), wolfram (W), hafnium (Hf) and mixtures thereof in a total amount of from 0.05 to 2.0 wt.-%, preferably from 0.05 to 1.5 wt.-%, based on the total weight of the aluminium alloy.

Additionally or alternatively, the aluminium alloy comprises at least one further alloying element selected from the group comprising lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu) and mixtures thereof. For example, the aluminium alloy comprises one further alloying element selected from the group comprising lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu) and mixtures thereof. Alternatively, the aluminium alloy comprises two or three further alloying elements selected from the group comprising lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu) and mixtures thereof.

If the aluminium alloy, i.e. the high electrical conductive, high temperature stable foil material, comprises at least one further alloying element selected from the group comprising lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu) and mixtures thereof, the aluminium alloy comprises the at least one further alloying element preferably in a total amount of ≤1.0 wt.-%, based on the total weight of the aluminium alloy. For example, the aluminium alloy comprises the at least one further alloying element selected from the group comprising lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu) and mixtures thereof in a total amount of from 0.01 to 1.0 wt.-%, preferably from 0.05 to 0.75 wt.-%, based on the total weight of the aluminium alloy.

Additionally or alternatively, the aluminium alloy comprises at least one further alloying element selected from the group comprising calcium (Ca), beryllium (Be), strontium (Sr), barium (Ba) and mixtures thereof. For example, the aluminium alloy comprises one further alloying element selected from the group comprising calcium (Ca), beryllium (Be), strontium (Sr), barium (Ba) and mixtures thereof. Alternatively, the aluminium alloy comprises two or three further alloying elements selected from the group comprising calcium (Ca), beryllium (Be), strontium (Sr), barium (Ba) and mixtures thereof.

If the aluminium alloy, i.e. the high electrical conductive, high temperature stable foil material, comprises at least one further alloying element selected from the group comprising calcium (Ca), beryllium (Be), strontium (Sr), barium (Ba) and mixtures thereof, the aluminium alloy comprises the at least one further alloying element preferably in a total amount of ≤0.5 wt.-%, based on the total weight of the aluminium alloy. For example, the aluminium alloy comprises the at least one further alloying element selected from the group comprising calcium (Ca), beryllium (Be), strontium (Sr), barium (Ba) and mixtures thereof in a total amount of from 0.01 to 0.5 wt.-%, preferably from 0.05 to 0.25 wt.-%, based on the total weight of the aluminium alloy.

Thus, it is appreciated that the aluminium alloy, i.e. the high electrical conductive, high temperature stable foil material, preferably comprises at least one further alloying element selected from the group comprising copper (Cu), manganese (Mn), magnesium-silicium (Mg—Si), zinc (Zn), lithium (Li), silver (Ag), iron (Fe), nickel (Ni), cobalt (Co), chromium (Cr), vanadium (V), titanium (Ti), niobium (Nb), tantalum (Ta), molybdenum (Mo), wolfram (W), hafnium (Hf), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu), calcium (Ca), beryllium (Be), strontium (Sr), barium (Ba) and mixtures thereof. In one embodiment of the present invention, the at least one further alloying element selected from the group comprising copper (Cu), manganese (Mn), magnesium-silicium (Mg—Si), zinc (Zn), lithium (Li), silver (Ag), iron (Fe), nickel (Ni), cobalt (Co), chromium (Cr), vanadium (V), titanium (Ti), niobium (Nb), tantalum (Ta), molybdenum (Mo), wolfram (W), hafnium (Hf), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu), calcium (Ca), beryllium (Be), strontium (Sr), barium (Ba) and mixtures thereof in a total amount of ≤8.5 wt.-% like from 0.1 to 8.5 wt.-%, based on the total weight of the aluminium alloy.

These further alloying elements can act in an additive manner with the at least two elements selected from the group consisting of scandium (Sc), magnesium (Mg), zirconium (Zr) and ytterbium (Yb), i.e., they can be dissolved above the equilibrium solubility limit with the at least two elements in the aluminium, and thereby enable an increase in strength via precipitation hardening.

It is appreciated that the remaining part to 100.0 wt.-% based on the total weight of the aluminium alloy, i.e. the foil material, refers to the aluminium present in the aluminium alloy and unavoidable impurities, like metallic and non-metallic impurities.

These impurities can each be present in a quantity of up to about 0.5 wt.-% and overall in a quantity of up to 2.0 wt.-%, based on the total weight of the aluminium alloy. However, such impurities do not detract from either the high electrical conductive, high temperature stable foil material according to the invention or its application nor from the process of the present invention.

In one embodiment of the present invention, the high electrical conductive, high temperature stable foil material, has been obtained by a process as described below.

According to another aspect of the present invention, a process for the preparation of a high electrical conductive, high temperature stable foil material as defined above is provided. The process comprises at least the steps of
a) melting a pre-material comprising aluminium and at least two elements selected from the group consisting of scandium (Sc), magnesium (Mg), zirconium (Zr), ytterbium (Yb) and manganese (Mn) for forming a molten aluminium alloy,
b) cooling the molten aluminium alloy to room temperature for forming a solidified aluminium alloy,
c) rolling the solidified aluminium alloy to a thickness of from 5.0 µm to 100.0 µm for forming a rolled aluminium alloy, and
d) annealing the rolled aluminium alloy at a temperature of at least 250° C.

The process according to the present invention allows the preparation of a high electrical conductive, high temperature stable foil material that exhibits an improved thermo mechanical stability and, furthermore, features an atomic oxygen resistance as well as Xe ion erosion resistance. For example, the high electrical conductive, high temperature stable foil material prepared based on the process according to the present invention exhibits a hardness and/or strength that is not affected by prolonged exposure to elevated temperatures. In particular, the prepared high electrical conductive, high temperature stable foil material features at room temperature, i.e. at a temperature of about 20° C., after exposure to high temperature, the same hardness and/or strength, than before the temperature exposure. For example, the prepared high electrical conductive, high temperature stable foil material features at room temperature, after exposure to a temperature of about 200° C., the same hardness and/or strength than before the temperature exposure. In one embodiment of the present invention, the prepared high electrical conductive, high temperature stable foil material features at room temperature, after exposure to a temperature of about 200° C. for at least 100 hours, the same hardness and/or strength than before the temperature exposure. For example, the prepared high electrical conductive, high temperature stable foil material features at room temperature, after exposure to a temperature of about 200° C. for at least 100 hours, the same hardness or strength than before the temperature exposure. Alternatively, the prepared high temperature stable foil material features at room temperature, after exposure to a temperature of about 200° C. for at least 100 hours, the same hardness and strength than before the temperature exposure.

In addition, the process enables the preparation of a high electrical conductive, high temperature stable foil material having a thickness of from 5.0 µm to 100.0 µm, preferably from 5.0 to 75.0 µm, more preferably from 5.0 µm to 50.0 µm, even more preferably from 5.0 µm to 40.0 µm, still more preferably from 5.0 µm to 25.0 µm and most preferably from 5.0 µm to 15.0 µm. For example, the process enables the preparation of a high electrical conductive, high temperature stable foil material having a thickness of from 5.0 µm to 50.0 µm, like from 10.0 µm to 25.0 µm.

According to step a) of the present invention, a pre-material comprising aluminium and at least two elements selected from the group consisting of scandium (Sc), magnesium (Mg), zirconium (Zr), ytterbium (Yb) and manganese (Mn) is molten for forming a molten aluminium alloy.

The pre-material used in the process comprises a mixture of aluminium and at least two elements, like two or three or four elements, selected from the group consisting of scandium (Sc), magnesium (Mg), zirconium (Zr), ytterbium (Yb) and manganese (Mn).

With regard to the aluminium, the at least two elements, like two or three or four elements, selected from the group consisting of scandium (Sc), magnesium (Mg), zirconium (Zr), ytterbium (Yb) and manganese (Mn) and their amounts in the aluminium alloy, it is referred to the definitions set out above when defining the instant high electrical conductive, high temperature stable foil material, its single components and their amounts.

Optionally, the pre-material further comprises at least one further alloying element selected from the group comprising copper (Cu), manganese (Mn), magnesium-silicium (Mg—Si), zinc (Zn), lithium (Li), silver (Ag), iron (Fe), nickel (Ni), cobalt (Co), chromium (Cr), vanadium (V), titanium (Ti), niobium (Nb), tantalum (Ta), molybdenum (Mo), wolfram (W), hafnium (Hf), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu), calcium (Ca), beryllium (Be), strontium (Sr), barium (Ba) and mixtures thereof is.

With regard to the at least one further alloying element, it is referred to the definitions set out above when defining the at least one further alloying element and their amounts.

It is appreciated that the pre-material of aluminium, the at least two elements selected from the group consisting of scandium (Sc), magnesium (Mg), zirconium (Zr), ytterbium (Yb) and manganese (Mn) and the optional at least one further alloying element can be prepared by mixing said components in the form of powder, chips, flakes, rods and the like. The skilled man will adapt the mixing conditions (such as the configuration of mixing speed) according to his process equipment.

Step a) of the process of the present invention requires a melting of the pre-material for forming a molten aluminium alloy.

A "molten" state in the meaning of the present invention is defined as the state in which a material is entirely liquid, in other words is entirely melted. In this regard, it is to be noted that melting occurs at constant temperature on application of energy, whereas a substance is molten as of the moment following melting, i.e. when the temperature begins to rise.

In one embodiment of the present invention, the melting of the pre-material is carried out at temperatures of ≥800° C., like in the range from 800 to 1 500° C., e.g. in the range from 800 to 1 000° C.

According to step b) of the present invention, a solidified aluminium alloy is formed by cooling the molten aluminium alloy to room temperature. Preferably, the cooling of the molten aluminium alloy to room temperature is carried out at a cooling rate of ≥10 K/sec and preferably of ≥20 K/sec. For example, the cooling of the molten aluminium alloy to room temperature is carried out at a cooling rate of from 10 K/sec to 100 000 K/sec, like from 20 K/sec to 100 000 K/sec.

In one embodiment of the present process, the cooling is preferably an accelerated cooling. Accordingly, the cooling of the molten aluminium alloy to room temperature is preferably carried out at a cooling rate of from 1 000 K/sec to 100 000 K/sec, like from 10 000 K/sec to 100 000 K/sec. The accelerated cooling makes it possible to keep considerably more of the at least two elements, like two or three or four elements, selected from the group consisting of scandium (Sc), magnesium (Mg), zirconium (Zr), ytterbium (Yb) and manganese (Mn) in solid solution in the aluminium base material than it would be possible in a state of equilibrium.

In the process of the present invention, the cooling of the molten aluminium alloy to room temperature can be carried out by any conventional cooling means known to the skilled person. For example, the cooling of the molten aluminium alloy to room temperature can be carried out by quenching in water, vaporization or atomization, the centrifuge molding method or the melt spin rapid solidification process.

The prepared solidified aluminium alloy, preferably obtained by the melt spin rapid solidification process, can be degassed under a vacuum by introducing the material into a vacuum chamber. During the degassing process, the solidified aluminium alloy, whose surface can be contaminated with hydrogen, oxides as well as hydroxides and moisture, is treated in a vacuum, so as to remove these potentially present, undesired contaminants. Vacuum degassing is performed in a suitable, gastight container, also referred to as vacuum chamber or recipient, wherein the latter exhibits a gas outlet connected with a vacuum system by way of a valve.

In one embodiment of the present invention, vacuum degassing is performed under a vacuum of 0.1 to $10^{-8}$ mbar. For example, the vacuum chamber can be controlled in such a way that the vacuum ranges from $10^{-2}$ to $10^{-7}$ mbar, preferably from $10^{-3}$ to $10^{-6}$ mbar.

In order to increase efficiency, the degassing process can be performed at an elevated temperature. In one embodiment of the present invention, vacuum degassing can be performed at a temperature of from 100 to 400° C., preferably from 250 to 380° C. or from 275 to 320° C., like from 290 to 300° C. However, it is also possible to perform vacuum degassing at other temperatures, for example at room temperature, i.e., at about 20° C.

For example, vacuum degassing can be performed over a period of 1 to 1 000 min, 10 to 500 min or 30 to 240 min. In one embodiment of the present invention, vacuum degassing is performed over a period of 60 min to 180 min.

After vacuum degassing, the solidified aluminium alloy can be compacted. Compaction can take place mechanically or with a gas pressure. Examples of suitable mechanical compaction methods are hydraulic pressing, cold pressing, isostatic pressing or vacuum pressing. One example of a suitable compaction method involves hydraulic pressing. Compaction can take place at atmospheric pressure or under a vacuum.

In one embodiment of the present invention, the solidified aluminium alloy is homogenized for forming a homogenized aluminium alloy.

If the instant process comprises a homogenizing step, the homogenizing is preferably carried out after process step b) and before process step c).

The homogenizing of the solidified aluminium alloy can be carried out by any conventional homogenizing means known to the skilled person. For example, the homogenizing of the solidified aluminium alloy can be carried out by treating the solidified aluminium alloy at increased temperature.

For example, the homogenizing of the solidified aluminium alloy is carried out at a temperature of ≥300° C., preferably of ≥400° C. and most preferably of ≥500° C. In one embodiment of the present invention, the homogenizing of the solidified aluminium alloy is carried out at a temperature from 300 to 610° C., preferably from 500 to 610° C. and most preferably from 600 to 610° C. It is appreciated that the homogenizing is preferably carried out a temperature being about 10° C. below the solidus temperature Ts of the solidified aluminium alloy. The term "solidus temperature" in the meaning of the present invention refers to the temperature below which the solidified aluminium alloy is completely solid.

The homogenizing of the solidified aluminium alloy can be performed over a period of 1 to 120 hours, 10 to 60 hours or 16 to 40 hours. In one embodiment of the present invention, homogenizing of the solidified aluminium alloy is performed over a period of 20 to 30 hours, like about 24 hours.

The homogenized aluminium alloy is formed by cooling the heat-treated aluminium alloy to room temperature. Preferably, the cooling of the aluminium alloy to room temperature is carried out at a cooling rate of ≥10 K/sec and preferably of ≥20 K/sec. For example, the cooling of the aluminium alloy to room temperature is carried out at a cooling rate of from 10 K/sec to 1 000 K/sec, like from 20 K/sec to 500 K/sec for the center of the solidified aluminium alloy.

The cooling of the heat-treated aluminium alloy to room temperature for homogenizing the solidified aluminium alloy can be carried out by any conventional cooling means known to the skilled person. For example, the cooling of the heat-treated aluminium alloy to room temperature can be carried out by quenching the aluminium alloy in water, preferably the water has a temperature of about room temperature, i.e. a temperature of about 20° C.

After homogenizing, the obtained homogenized aluminium alloy can be formed to fabricate a semi-finished product and molded articles. Examples of suitable forming methods are extrusion or extrusion molding, forging, stretch forming, stamping, impact extrusion or deep drawing.

In one embodiment of the present invention, the homogenized aluminium alloy is processed further via extrusion at a temperature of from 300 to 400° C., preferably from 320 to 375° C. or from 340 to 350° C.

The extrusion of the homogenized aluminium alloy can be performed over a period of 30 to 240 min, 45 to 200 min or 60 to 180 min. In one embodiment of the present invention, extrusion of the homogenized aluminium alloy is performed over a period of 90 to 120 min.

According to step c) of the present process, the solidified aluminium alloy is rolled to a thickness of from 5.0 µm to 100.0 µm for forming a rolled aluminium alloy.

In the process of the present invention, the rolling of the solidified aluminium alloy can be carried out by any conventional rolling means known to the skilled person. For example, the rolling of the solidified aluminium alloy can be carried out by any means suitable to obtain a thickness of from 5.0 µm to 100.0 µm for the aluminium alloy. In one embodiment of the present invention, the rolling of the solidified aluminium alloy is carried out by the cold rolling technology.

For example, the rolling of the solidified aluminium alloy is carried out at a temperature of ≤100° C., preferably of ≤80° C. and most preferably of ≤50° C. In one embodiment of the present invention, the rolling of the solidified aluminium alloy is carried out at a temperature of from 10 to 100° C., preferably from 10 to 80° C. and most preferably from 15 to 50° C., like from 15 to 30° C. For example, the rolling of the solidified aluminium alloy is carried out at room temperature, i.e. of about 20° C.

The rolled aluminium alloy obtained in step c) has a thickness of from 5.0 µm to 100.0 µm, preferably from 5.0 to 75.0 µm, more preferably from 5.0 µm to 50.0 µm, even more preferably from 5.0 µm to 40.0 µm, still more preferably from 5.0 µm to 25.0 µm and most preferably from 5.0 µm to 15.0 µm. For example, the rolled aluminium alloy obtained in step c) has a thickness of from 5.0 µm to 50.0 µm, like from 10.0 µm to 25.0 µm.

During and/or after rolling, preferably after rolling, the obtained rolled aluminium alloy can be subjected to an intermediate annealing. Such intermediate annealing is advantageous in order to prevent edge cracking of the rolled aluminium alloy caused by exhausting of deformation capabilities.

The intermediate annealing of the rolled aluminium alloy can be carried out by any conventional annealing means known to the skilled person. For example, the intermediate annealing of the rolled aluminium alloy can be carried out by treating the rolled aluminium alloy at increased temperature.

For example, the intermediate annealing of the rolled aluminium alloy is carried out at a temperature of ≥200° C., preferably of ≥250° C. and most preferably of ≥300° C. In one embodiment of the present invention, the intermediate annealing of the rolled aluminium alloy is carried out at a temperature of from 200 to 610° C., preferably from 250 to 610° C. and most preferably from 300 to 610° C., like from 350 to 610° C. It is appreciated that the intermediate annealing is preferably carried out a temperature being about 10° C. below the solidus temperature Ts of the rolled aluminium alloy.

The intermediate annealing of the rolled aluminium alloy can be performed over a period of 1 to 120 min, 5 to 60 mins or 10 to 45 mins. In one embodiment of the present invention, the intermediate annealing of the rolled aluminium alloy is performed over a period of 10 to 30 mins, like about 15 mins.

According to step d) of the present process, it is one further requirement that the rolled aluminium alloy is annealed at a temperature of at least 250° C.

Such annealing is advantageous in order to stabilize the aluminium alloy such that the obtained high electrical conductive, high temperature stable foil material features a high thermo mechanical stability.

The annealing of the rolled aluminium alloy according to step d) of the present process can be carried out by any conventional annealing means known to the skilled person. For example, the annealing of the rolled aluminium alloy according to step d) of the present process can be carried out by any means suitable to treat the rolled aluminium alloy at increased temperature.

For example, the annealing of the rolled aluminium alloy according to step d) of the present process is carried out at a temperature of ≥250° C., preferably of ≥270° C. and most preferably of ≥290° C. In one embodiment of the present invention, the annealing of the rolled aluminium alloy according to step d) of the present process is carried out at a temperature of from 250 to 400° C., preferably from 270 to 360° C. and most preferably from 290 to 320° C., like from 295 to 310° C.

The annealing of the rolled aluminium alloy according to step d) of the present process can be performed over a period of 1 to 120 min, 5 to 60 mins or 10 to 45 mins. In one embodiment of the present invention, the annealing of the rolled aluminium alloy according to step d) of the present process is performed over a period of 10 to 30 mins, like about 15 mins.

The annealed aluminium alloy is preferably cooled to room temperature. In one embodiment of the present invention, the cooling of the annealed aluminium alloy to room temperature is carried out at a cooling rate of ≥10 K/sec and preferably of ≥20 K/sec. For example, the cooling of the annealed aluminium alloy to room temperature is carried out at a cooling rate of from 10 K/sec to 1 000 K/sec, like from 20 K/sec to 500 K/sec.

In the process of the present invention, the cooling of the annealed aluminium alloy to room temperature can be carried out by any conventional cooling means known to the skilled person. For example, the cooling of the annealed aluminium alloy to room temperature can be carried out by quenching the annealed aluminium alloy in water, preferably the water has a temperature of about room temperature, i.e. a temperature of about 20° C.

As already mentioned above, the foil material prepared by the process according to the present invention is a high electrical conductive, high temperature stable foil material, i.e. the hardness and/or strength does not change after exposure to elevated temperature. For example, the high electrical conductive, high temperature stable foil material features at room temperature, i.e. at about 20° C., after exposure to a temperature of about 200° C. the same hardness and/or strength, than before the temperature exposure.

In one embodiment of the present invention, the high electrical conductive, high temperature stable foil material features at room temperature, after exposure to a temperature of 200° C. for at least 100 hours, the same hardness and/or strength than before the temperature exposure. For example, the high electrical conductive, high temperature stable foil material features at room temperature, after exposure to a temperature of 200° C. for at least 100 hours, the same hardness or strength than before the temperature exposure. Alternatively, the high electrical conductive, high temperature stable foil material features at room temperature, after exposure to a temperature of 200° C. for at least 100 hours, the same hardness and strength than before the temperature exposure.

Accordingly, the high electrical conductive, high temperature stable foil material has an improved thermo mechanical stability. In particular, the high electrical conductive, high temperature stable foil material has a high thermo mechanical cycling stability. Furthermore, the high electrical conductive, high temperature stable foil material features an atomic oxygen resistance as well as Xe ion erosion resistance.

In view of the very good results obtained for the high electrical conductive, high temperature stable foil material, as defined above, a further aspect of the present invention refers to a solar cell interconnector comprising the high electrical conductive, high temperature stable foil material.

In one embodiment of the present invention, the solar cell interconnector consists of the high electrical conductive, high temperature stable foil material.

Furthermore, the present invention refers in another aspect to the use of the high electrical conductive, high temperature stable foil material, as defined above, and/or the solar cell interconnector, as defined above, in solar power, aircraft or space applications.

The following examples may additionally illustrate the invention but are not meant to restrict the invention to the exemplified embodiments:

EXAMPLES

1. Preparation of Examples

The comparative and inventive examples were prepared as follows:

a) Comparative Example CE

An AlMg3 alloy was purchased as 35 mm thick extruded rod material in accordance with DIN 17007 3.3535.

b) Inventive Example IE1

An AlSc0.6Zr0.3 alloy was manufactured by melting of commercially available pure Al together with the required amount of AlSc2 master and AlZr5 master alloys at about 900° C. to dissolve (by diffusion) safely all Al$_3$Sc and Al$_3$Zr dispersoids (Al$_3$Sc has a nominal melting temperature of 1320° C., Al$_3$Zr has a nominal melting temperature of 1580° C.). In order to keep both alloying elements for further processing in solid solution in the Al matrix very fast cooling to room temperature melt-spin rapid solidification was used: The molten material is cast through a tiny nozzle on a fast rotating water cooled Cu-drum which immediately solidifies and separates as an endless 50-100 μm thick ribbon from this drum. The estimated cooling velocity is about 10 000-100 000 K/sec. The endless ribbon material was chopped by a rotating knife. The resulting flakes were then further processed by putting the flakes into a sealed heatable recipient where a vacuum-degassing at about 290-300° C./120 min until final vacuum of more than 10$^{-3}$ mbar was applied. Afterwards, with the help of a hydraulic press device, the flakes were compacted (still located in the sealed recipient) into a 95-98% dense rod material. The rod material was then subjected to extrusion as described below.

c) Inventive Example IE2

An AlSc0.6Zr0.3Yb0.15 alloy was manufactured by melting of commercially available pure Al together with the required amount of an AlSc2 master, AlYb2 master and AlZr5 master alloys at about 900° C. to dissolve (by diffusion) safely all Al$_3$Sc, Al$_3$Yb and Al$_3$Zr dispersoids (Al$_3$Sc has a nominal melting temperature of 1320° C., Al$_3$Yb has a nominal melting temperature of 980° C., Al$_3$Zr has a nominal melting temperature of 1580° C.). In order to keep the 3 alloying elements for further processing in solid solution in the Al matrix very fast cooling to room temperature by the melt-spin rapid solidification technology was used: The molten material was cast through a tiny nozzle on a fast rotating water cooled Cu-drum which immediately solidified and separated as an endless 50-100 μm thick ribbon from this drum. The estimated cooling velocity is about 10 000-100 000 K/sec. The endless ribbon material was chopped by a rotating knife. The resulting flakes were then further processed by putting the flakes into a sealed heatable recipient where a vacuum-degassing at about 290-300° C./120 min. until a final vacuum of more than 10$^{-3}$ mbar was applied. Afterwards, with the help of a hydraulic press device, the flakes were compacted (still located in the sealed recipient) into a 95-98% dense rod material. The rod material was then subjected to extrusion as described below.

2. Extrusion of Examples

The prepared samples CE as well as IE1 and IE2 were extruded under the same parameters into 1.5 mm thick and 21.5 mm wide strips (extrusion ratio 23:1). Therefore, the rods were heated in an extrusion die device in a furnace up to 340-350° C. This process to heat up the device last about 90-120 min. Then, the die was immediately transferred to a servohydraulic press and the controlled extrusion with a maximum extrusion speed (related to the extruded strip) of 1 000 mm/min was carried out. By this, it can be excluded that during extrusion (due to "internal" material friction and external die surface–extrusion material friction) an undesired (so called "adiabatic") material up-heating beyond the targeted 340-350° C. does occur.

3. Results Obtained

Figure 2:
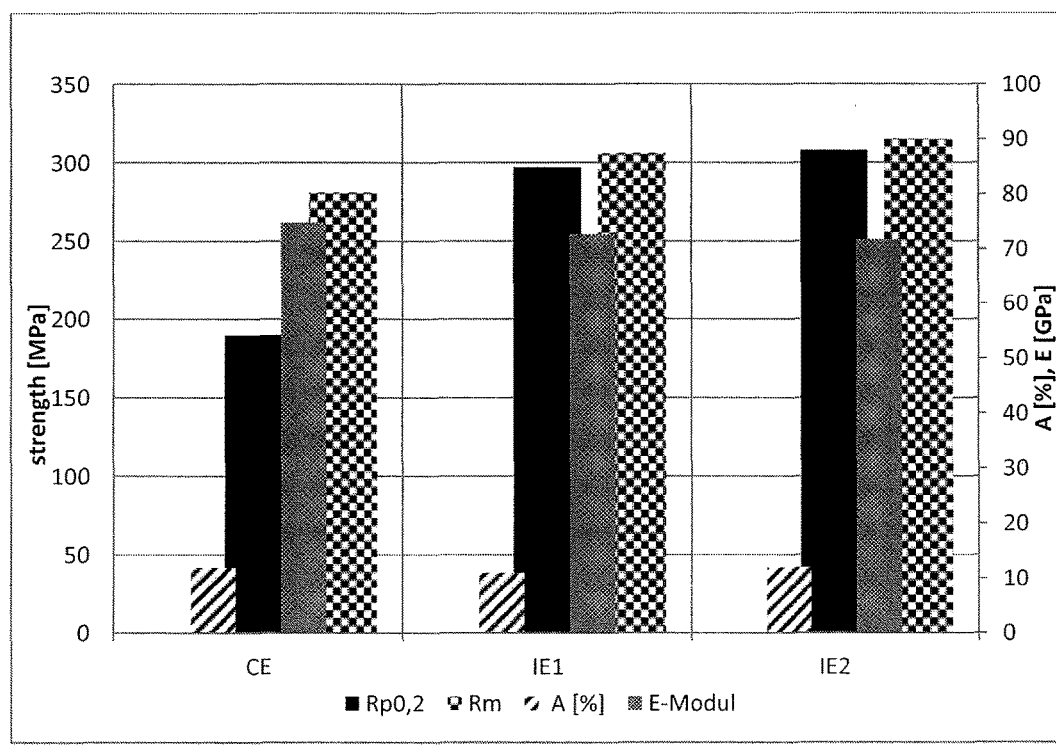
FIG. 2 illustrates key mechanical properties measured on inventive examples IE1 and IE2 and the comparative example CE obtained by tensile testing.

The advantages of IE1 and IE2 of enhanced electrical conductivity and enhanced thermal fatigue strength compared with the state of the art AlMg3 (comparative example CE) are demonstrated by these samples. The key mechanical properties, obtained by tensile testing, are summarized in Table 1 and are illustrated graphically in FIG. 2. While elongation at break A, and the Youngs's modulus E, both measured in accordance with ISO 6892, are hardly affected, Rp0.2, measured also in accordance with ISO 6892 is increased by approximately 50%. Thus the ratio Rp0.2/E is increased by a similar amount. This results in a higher fatigue resistance in an application as solar cell interconnector, which represents in essence a strain controlled fatigue setup.

TABLE 1

Mechanical properties measured on inventive examples IE1 and IE2 and the comperative example CE

| material | | $R_{p0.2}$ [MPa] | Rm [Mpa] | A [%] | E-modulus | $R_{p0.2}/E$ [*10$^{-3}$] |
|---|---|---|---|---|---|---|
| AlMg3 | CE | 190 | 281 | 12 | 74.8 | 2.54 |
| AlSc0.6Zr0.3 | IE1 | 297 | 306 | 11 | 72.7 | 4.09 |
| AlSc0.6Zr0.3Yb0.15 | IE2 | 308 | 315 | 12 | 71.7 | 4.3 |

Figure 3:
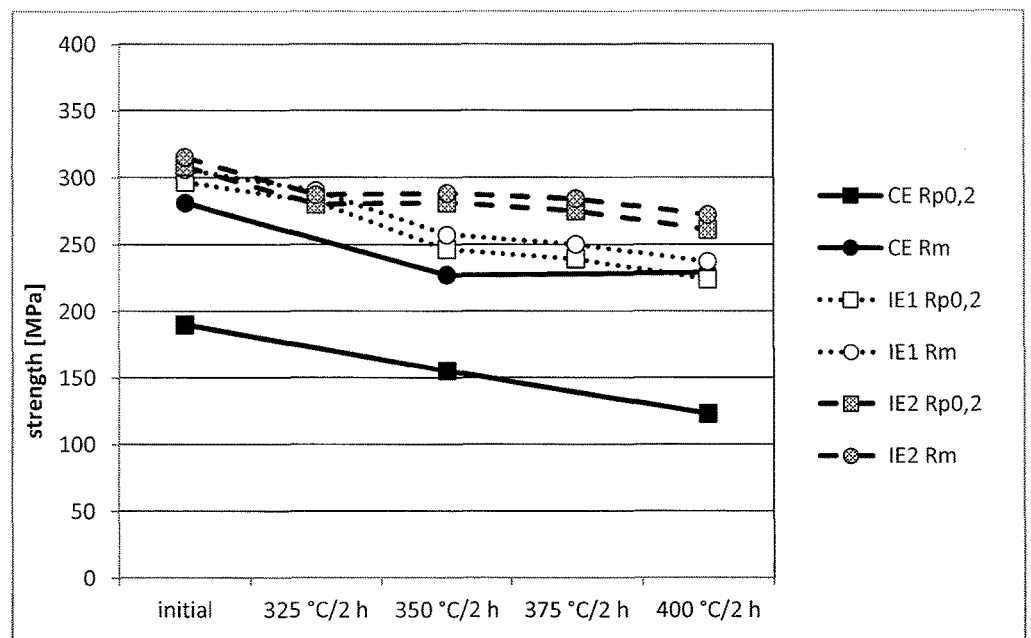
FIG. 3 illustrates room temperature mechanical properties of CE, IE1 and IE2 plotted for temperature exposures of 2 hours, each starting at 325° C. up to 400° C.

In FIG. 3, the room temperature mechanical properties of CE, IE1 and IE2 are plotted for temperature exposures of 2 hours, each starting at 325° C. up to 400° C. The measurements show that the improved mechanical properties of IE1 and IE2 compared to CE remain valid, even after exposure to elevated temperatures. The unavoidable decrease of Rp0.2 and Rm with temperature are much less pronounced, in particular in AlSc0.6Zr0.3Yb0.15 (IE2), compared to CE. The almost unaffected strength values of IE1 and IE2 after the first heating step of 325° C. for 2 hours justifies the claim of extended stability at the significantly lower temperature of 200° C.

Figure 4:
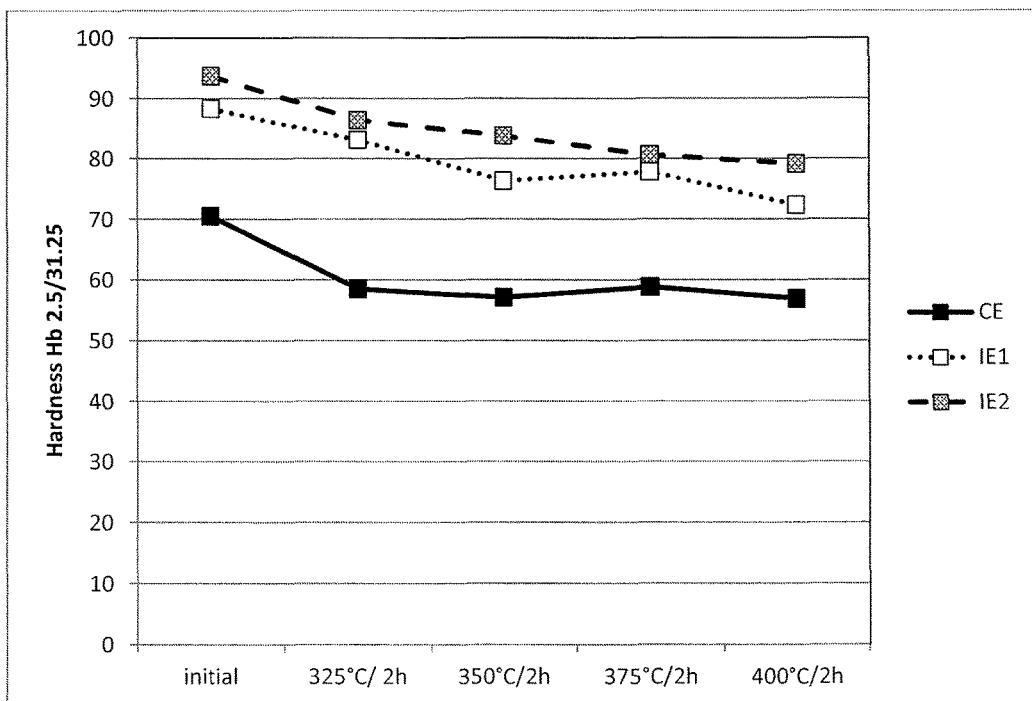
FIG. 4 illustrates hardness measurements showing improved hardness of IE1 and IE2 compared to CE even after exposure to elevated temperatures.

Furthermore, the corresponding hardness measurements, illustrated in FIG. 4, show that the improved hardness of IE1 and IE2 compared to CE remains valid even after exposure to elevated temperatures.

Figure 5:
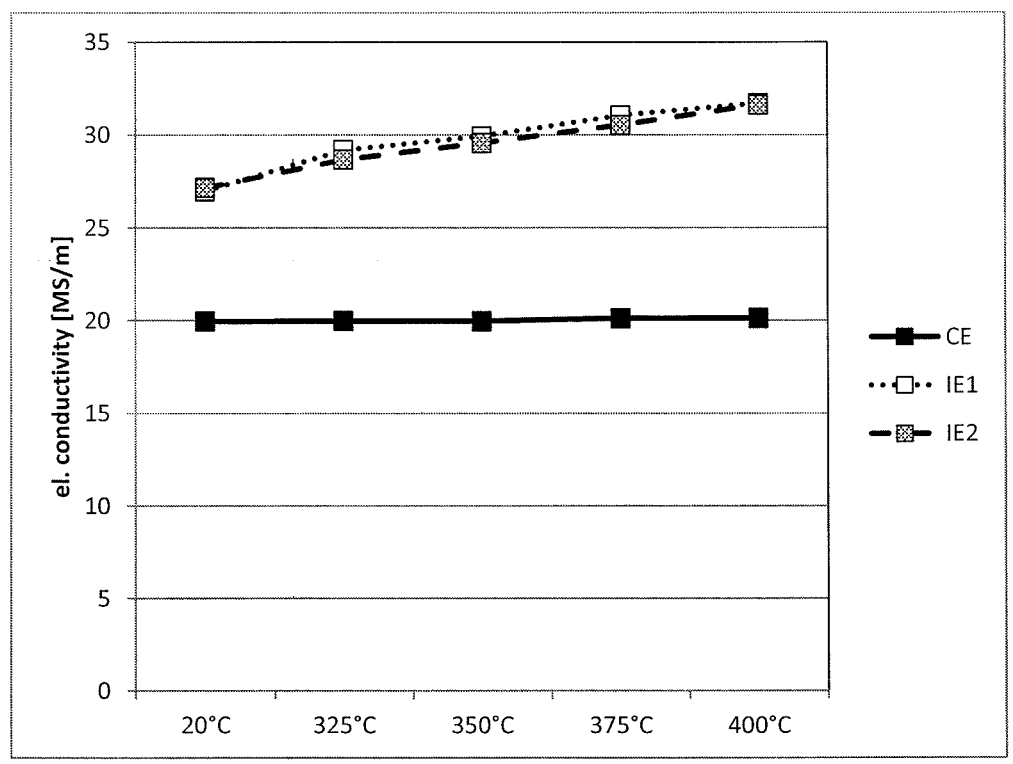
FIG. 5 illustrates the measured electrical conductivity of CE and IE1 and IE2.

Finally the measured electrical conductivity of CE and IE1 and IE2 is outlined in FIG. 5. This supports the claim of a significantly improved electrical conductivity for the inventive examples compared to the comparative material.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:
1. A high electrical conductive, high temperature stable foil material comprising:
an aluminium alloy having at least two elements selected from the group consisting of scandium (Sc), magnesium (Mg), zirconium (Zr), ytterbium (Yb) and manganese (Mn),
wherein the aluminium alloy comprises ytterbium (Yb) in an amount from 0.075 to 0.5 wt.-%, based on the total weight of the aluminium alloy.
2. The high electrical conductive, high temperature stable foil material according to claim 1, wherein the aluminium alloy comprises at least one of:
a) scandium (Sc) in an amount from 0.1 to 1.0 wt.-%, based on the total weight of the aluminium alloy, and/or
b) magnesium (Mg) in an amount from 0.1 to 5.0 wt.-%, based on the total weight of the aluminium alloy, and/or
c) zirconium (Zr) in an amount from 0.075 to 0.5 wt.-%, based on the total weight of the aluminium alloy, and/or
d) manganese (Mn) in an amount from 0.075 to 0.6 wt.-%, based on the total weight of the aluminium alloy.
3. The high electrical conductive, high temperature stable foil material according to claim 1, wherein the aluminium alloy comprises between two and four elements selected from the group consisting of scandium (Sc), magnesium (Mg), zirconium (Zr), ytterbium (Yb) and manganese (Mn).
4. The high electrical conductive, high temperature stable foil material according to claim 1, wherein the aluminium alloy comprises one of:
a) scandium (Sc) in an amount from 0.1 to 1.0 wt.-%, based on the total weight of the aluminium alloy, or
b) magnesium (Mg) in an amount from 0.1 to 3.2 wt.-%, based on the total weight of the aluminium alloy.
5. The high electrical conductive, high temperature stable foil material according to claim 1, wherein the aluminium alloy at least one of:
a) comprises scandium (Sc) in an amount from 0.1 to 1.0 wt.-% and zirconium (Zr) in an amount from 0.075 to 0.5 wt.-%, based on the total weight of the aluminium alloy, and/or
b) comprises scandium (Sc), zirconium (Zr) and ytterbium (Yb) in a weight ratio [Sc/Zr/Yb] from 1/½/¼ to 1/⅓/¼.
6. The high electrical conductive, high temperature stable foil material according to claim 1, wherein the aluminium alloy
a) comprises magnesium (Mg) in an amount from 0.1 to 5.0 wt.-%, scandium (Sc) in an amount from 0.1 to 1.0 wt.-%, zirconium (Zr) in an amount from 0.075 to 0.5 wt.-% and manganese (Mn) in an amount from 0.075 to 0.6 wt.-%, based on the total weight of the aluminium alloy, and/or
b) comprises magnesium (Mg), scandium (Sc), manganese (Mn) and zirconium (Zr) in a weight ratio [Mg/Sc/Mn/Zr] from 1/¹⁄₁₈/¹⁄₅₇/¹⁄₅₁ to 1/¹⁄₂₀/¹⁄₇/¹⁄₄₀.
7. The high electrical conductive, high temperature stable foil material according to a claim 1, wherein the aluminium alloy comprises at least one further alloying element selected from the group comprising copper (Cu), manganese (Mn), magnesium-silicium (Mg—Si), zinc (Zn), lithium (Li), silver (Ag) and mixtures thereof in a total amount of ≤5.0 wt.-%, based on the total weight of the aluminium alloy.

8. The high electrical conductive, high temperature stable foil material according to claim 1, wherein the aluminium alloy comprises at least one further alloying element selected from the group comprising iron (Fe), nickel (Ni), cobalt (Co), chromium (Cr), vanadium (V), titanium (Ti), niobium (Nb), tantalum (Ta), molybdenum (Mo), wolfram (W), hafnium (Hf) and mixtures thereof in a total amount of ≤2.0 wt.-%, based on the total weight of the aluminium alloy.
9. The high electrical conductive, high temperature stable foil material according to claim 1, wherein the aluminium alloy comprises at least one further alloying element selected from the group comprising at least one further alloying element selected from the group comprising lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), lutetium (Lu) and mixtures thereof in a total amount of ≤1.0 wt.-%, based on the total weight of the aluminium alloy.
10. The high electrical conductive, high temperature stable foil material according to claim 1, wherein the aluminium alloy comprises at least one further alloying element selected from the group comprising calcium (Ca), beryllium (Be), strontium (Sr), barium (Ba) and mixtures thereof in a total amount of ≤0.5 wt.-%, based on the total weight of the aluminium alloy.
11. The high electrical conductive, high temperature stable foil material according to claim 1, wherein the high electrical conductive, high temperature stable foil material has a thickness of from 5.0 μm to 100.0 μm.
12. The high electrical conductive, high temperature stable foil material according to claim 1, wherein the high electrical conductive, high temperature stable foil material features at room temperature, after being exposed to a temperature of 200° C. for at least 100 hours, the same hardness and/or strength than before the temperature exposure.
13. A solar cell interconnector comprising the high electrical conductive, high temperature stable foil material according to claim 1.
14. A solar power aircraft or space device comprising:
the high electrical conductive, high temperature stable foil material according to claim 1.
15. The solar power aircraft or space device according to claim 14, further comprising a solar cell interconnector comprising the high electrical conductive, high temperature stable foil material.
16. A high electrical conductive, high temperature stable foil material that includes an aluminium alloy having at least two elements selected from the group consisting of scandium (Sc), magnesium (Mg), zirconium (Zr), ytterbium (Yb) and manganese (Mn)J wherein the aluminium alloy at least one of:
a) comprises scandium (Sc) in an amount from 0.1 to 1.0 wt.-%, zirconium (Zr) in an amount from 0.075 to 0.5 wt.-% and ytterbium (Yb) in an amount from 0.075 to 0.5 wt.-%, based on the total weight of the aluminium alloy, and/or
b) comprises scandium (Sc), zirconium (Zr) and ytterbium (Yb) in a weight ratio [Sc/Zr/Yb] from 1/½/¼ to 1/⅓/⅓.
17. A process for the preparation of a high electrical conductive, high temperature stable foil material, the process comprising:
a) melting a pre-material comprising aluminium and at least two elements selected from the group consisting of scandium (Sc), magnesium (Mg), zirconium (Zr), ytterbium (Yb) and manganese (Mn) for forming a molten aluminium alloy;
b) cooling the molten aluminium alloy to room temperature for forming a solidified aluminium alloy;
c) rolling the solidified aluminium alloy to a thickness of from 5.0 µm to 100.0 µm for forming a rolled aluminium alloy; and
d) annealing the rolled aluminium alloy at a temperature of at least 250° C.,
wherein the aluminium alloy comprises ytterbium (Yb) in an amount from 0.075 to 0.5 wt.-%, based on the total weight of the aluminium alloy.

* * * * *